United States Patent [19]

De Mesmaeker

[11] Patent Number: 4,458,285

[45] Date of Patent: Jul. 3, 1984

[54] METHOD AND DEVICE FOR FINDING FAULTS ON ELECTRIC LINES BY THE PRINCIPLE OF LOW IMPEDANCE

[75] Inventor: Ivan De Mesmaeker, Windisch, Switzerland

[73] Assignee: BBC Brown, Boveri & Company, Limited, Baden, Switzerland

[21] Appl. No.: 420,286

[22] Filed: Sep. 20, 1982

[30] Foreign Application Priority Data

Sep. 22, 1981 [CH] Switzerland .......................... 6094/81

[51] Int. Cl.³ .......................................... H02H 7/26
[52] U.S. Cl. ........................................ 361/79; 324/52; 361/80
[58] Field of Search .................. 361/79, 80, 82, 84, 361/85; 324/52

[56] References Cited

U.S. PATENT DOCUMENTS 3,325,687  6/1967  Ungrad .............................. 361/82
4,128,805 12/1978  Lanz ................................ 361/80 X

FOREIGN PATENT DOCUMENTS 480134 11/1975 U.S.S.R. .............................. 361/80

Primary Examiner—Harry E. Moose, Jr.
Attorney, Agent, or Firm—Burns, Doane, Swecker & Mathis

[57] ABSTRACT

The invention relates to a low impedance excitation system for use in distance relays. In such a system the low impedance check is carried out by comparing the phases of signals ($U_D, U_S$) which are obtained by forming the sum and the difference from an image voltage signal ($U_A$) and a line voltage signal ($U_K$). The triggering characteristic is formed in the complex impedance plane by means of the combination of at least two different triggering characteristics, mainly a circular (K) and a lenticular (L) characteristic, in order to avoid overlapping between the triggering area and the active load area (W) and in order to achieve an adequate arc reserve on the whole length of line to be monitored. The switching over between the different triggering characteristics (K,L) takes place as an operational function of the phase difference ($\beta$) between the image voltage signal ($U_A$) and the line voltage signal ($U_K$).

9 Claims, 3 Drawing Figures

METHOD AND DEVICE FOR FINDING FAULTS ON ELECTRIC LINES BY THE PRINCIPLE OF LOW IMPEDANCE

BACKGROUND OF THE INVENTION

The invention relates to a method for finding faults on electric lines by the principle of low impedance in which the phase difference between sum and difference signals derived from the line current and voltage are compared with a limit value, and a device for implementing the method.

Such a method and such a device have been disclosed, for example, in the Company Bulletin of BBC Aktiengesellschaft Brown, Boveri & Cie., Baden/-Switzerland, entitled "LZ91, LZ92 Static Distance Relays", May 1981 edition, No. CH-ES 25-90, and are used as a method or circuit for excitation in distance relays. In the distance relay, the excitation function has the job of detecting a fault on the line, that is to say on its greatest length to be monitored, and to start, by means of a fault signal, further measuring units of the distance relay which identify the reported fault by type and distance and cause a selective switch-off of the faulty line section.

Depending on the characteristics of the line to be monitored and the types of faults to be expected, a specially suited triggering characteristic, that is to say a triggering range in the complex impedance plane, must be determined for the low-impedance excitation function. In the above-mentioned literature reference, a distance relay is described which uses the area of a circle as the triggering characteristic. In the case of a circular characteristic, the test for whether the point of the impedance vector—of the impedance from the point of relay installation to the location of the fault—corresponding to a particular fault is located inside or outside the triggering area can be carried out electronically by means of a phase comparison method which is also described in the Company Bulletin CH-ES 25/90. This method uses voltage signals the amplitude and phase relationship of which correspond to the impedances. Thus, a current/voltage transformer, the secondary of which is loaded with an ohmic resistance, is used to generate an image voltage signal and a voltage transformer is used to generate a line voltage signal and these signals are used to form both a difference and a sum voltage signal. If the phase difference, which is continuously monitored, exceeds the limit value of 90° between the difference and the sum signals—the phase angle is calculated to be positive in the counterclockwise direction in accordance with the usual convention—the point of the impedance vector is inside the triggering circle which has its centre in the origin if the full amplitude of the image voltage signal is used for forming the sum. Frequently, however, it is of advantage to use a triggering circle which is slightly displaced with respect to the origin by amplitude modulating the image voltage signal before forming the sum. The magnitude of the triggering circle corresponds to the range of excitation with respect to the line lengths. If the lines to be monitored are long, the radius of the triggering circle must be selected to be correspondingly large. This, however, brings with it the danger of faulty triggering since with a large radius the triggering circle partially covers the active load area. In order to prevent such faulty triggering, a lenticular triggering characteristic can be used instead of a circular characteristic.

Such a lenticular triggering characteristic, which is also displaced, has been disclosed, for example, in the Company Bulletin of the BBC Aktiengesellschaft Brown, Boveri and Cie., Baden/Switzerland, entitled "LZ79 Static Distance Relay", November 1980 edition No. CH-ES 65-96. The low impedance check can then be carried out by means of the same phase comparison method by selecting a larger limit value for the phase difference that is monitored.

The significant disadvantage of the lenticular triggering characteristic consists however in that an insufficient arc reserve exists at the points of the lens, that is to say for faults occurring at a distance, which for this reason cannot be detected by the excitation function.

OBJECT AND SUMMARY OF THE INVENTION

The invention is, therefore, based on the object of finding for the low-impedance excitation function of the generic type a triggering characteristic which is technically simple to implement and to check and which is provided both with an adequate safety margin with respect to the active load area and with an adequate arc reserve for the faults located at a distance.

According to the invention, this object is achieved by the limit value being dynamically adjusted as an operational function of a second phase difference, which is additionally determined between the line voltage signal and the image voltage signal.

A particular advantage of the invention must be considered to be the fact that the inventive development of a proven low-impedance method combines the advantages of various triggering characteristics whilst avoiding their disadvantages.

BRIEF DESCRIPTION OF THE DRAWINGS

In the text which follows, an illustrative embodiment of the invention is explained with the aid of drawings in which.

DETAILED DESCRIPTION

Figure 1:
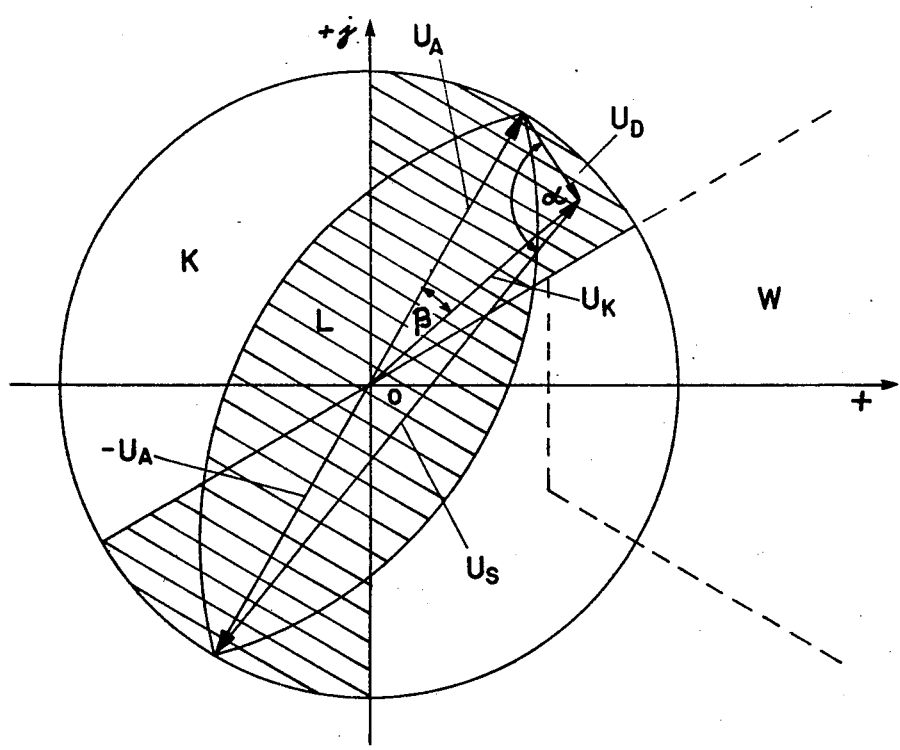
FIG. 1 shows a vector diagram in the complex impedance or voltage plane, with various triggering areas and the active load area.

In the vector diagram of FIG. 1, the vector of the line current $I_L$ has been drawn along the positive real axis. If thus defines the phase zero. The vectors of the image voltage signal $U_A$ and of the line voltage signal $U_K$ and, in the manner of vector arrows, the displaced vectors of the difference $U_D$ and of the sum voltage signal $U_S$ formed with the full amplitude of the image voltage signal $U_A$ has been drawn to be leading with respect to the line current $I_L$. With a fixed limit value G of their phase difference $\alpha$, the difference voltage signal $U_D$ and the sum voltage $U_S$ define the triggering area in the complex plane. For a limit value G of 90°, the circular area K shown in FIG. 1 is obtained as the triggering area, and for 136° the lenticular area L. Both triggering characteristics are associated with decisive disadvantages. Thus, if the circular area K has a large radius, it partially overlaps the active load area W which leads to false triggering, whereas, although the lenticular area L avoids this problem, there is insufficient ohmic arc reserve at its points, that is to say in the case of faults which are located at a distance. However, as a result of the dynamic switch-over according to the invention between different triggering characteristics as an operational function of the second phase difference $\beta$, determined additionally between the line voltage signal $U_K$ and the image voltage signal $U_A$, the advantages of different triggering characteristics can be combined and jointly utilized and their disadvantages can be avoided. In FIG. 1 this has been shown by means of the example of the circular area K and the lenticular area L. Switching over to the circular characteristic is always done when the second phase difference $\beta$ is located in the vicinity of 0° or 180° and to the lenticular characteristic if it is located outside these neighbourhoods. Such a combination produces as a triggering area the hatched area and which over the whole length of the line has sufficient arc reserve and an adequate margin with respect to the active load area W. The width of the neighbourhoods of 0° and 180° in which the limit value G is adjusted to 90°, as in this illustrative embodiment, is decisively dependent on the magnitude of the image voltage signal $U_A$ and its phase lead with respect to the line current $I_L$, or in other words, on its position relative to the active load area W in the complex plane. When many lines are to be monitored, an optimum triggering characteristic with respect to the active load area W, the desired range of excitation and with respect to equalizing currents is obtained with short circuits—single-pole in the case of multi-phase systems, when the above-mentioned phase lead of the image voltage signal $U_A$ is about 60° and the neighbourhoods of 0° and 180° are about ±30° wide.

Figure 2:
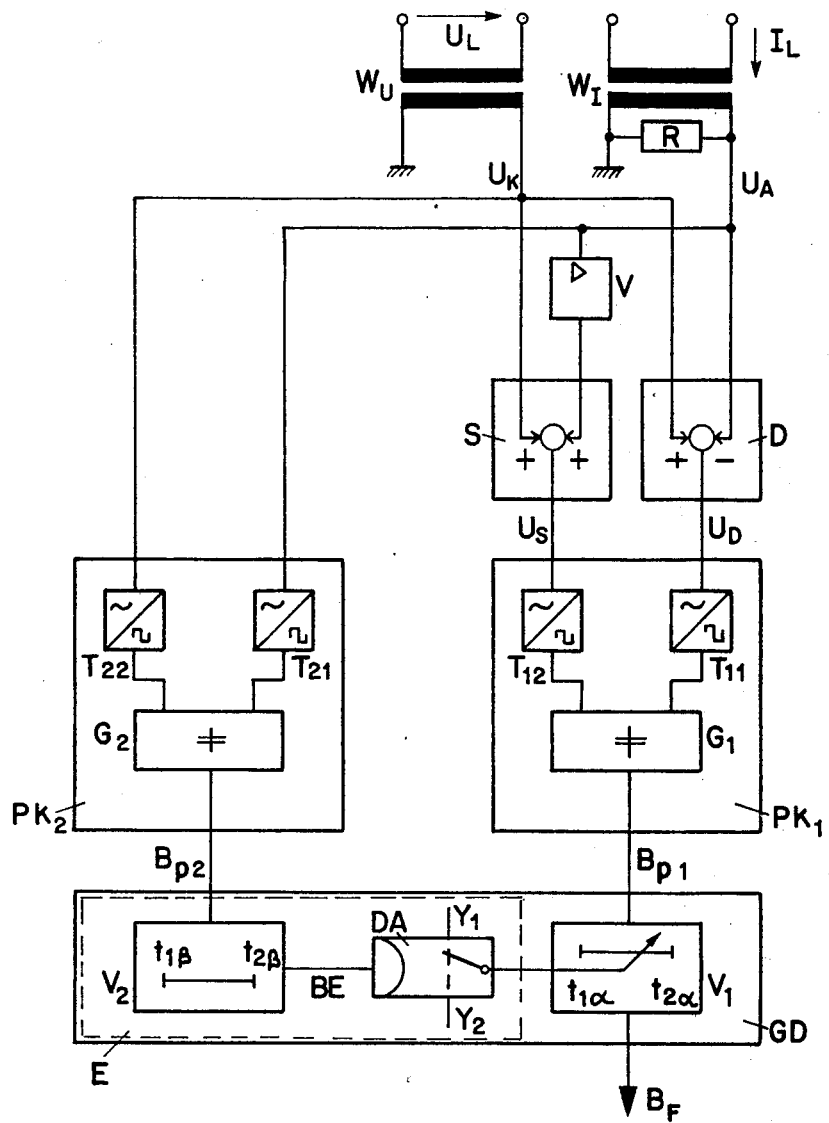
FIG. 2 shows a block diagram of the device according to the invention.

FIG. 2 shows the block diagram of a device which is suitable for carrying out the method described. To the primary of the voltage transformer $W_U$ and of the current/voltage transformer $W_I$ the line voltage $U_L$ and the line current $I_L$—or appropriately transformed values of these if preceding main current transformers, not drawn, are additionally used—are applied and the secondaries of these transformers are in each case connected to the inputs of the difference stage D and of the sum stage S or of the amplifier V preceding them and to the inputs of the second phase comparator $Pk_2$. In addition, the secondary of the current/voltage transformer $W_I$ is loaded with an ohmic resistance R. The outputs of the difference stage D and of the sum stage S are connected to the inputs of the first phase comparator $Pk_1$ the output of which is connected to the input of the limit value detector GD. The output of the second phase comparator $Pk_2$ is connected to the circuit part E of the limit value detector GD by means of which the limit value G in the limit value detector GD is adjusted.

Figure 3:
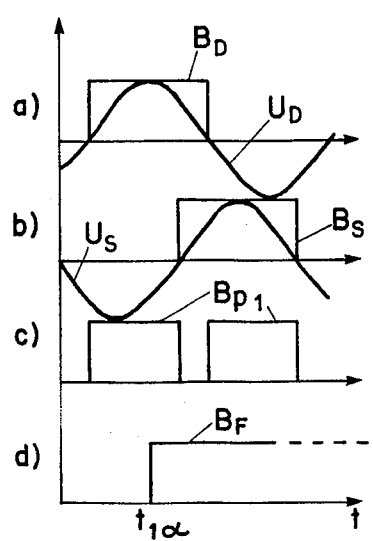
FIG. 3 shows the relative phase relationship of electric signals which are active or generated in the functional units of the device.

The two phase comparators $Pk_1$ or $Pk_2$ and the limit value detector, can be advantageously constructed by means of digital electronics as is shown in the coresponding blocks of FIG. 2. For this purpose, in the first instance the analog sinusoidal input signals $U_D$, $U_S$ or $U_A$, $U_K$ are converted in a correct phase into the binary signals $B_D$, $B_S$ or $B_A$, $B_K$ by means of the pulse shapers $T_{11}$, $T_{12}$ or $T_{21}$, $T_{22}$. These binary signals are then subjected to logic operations by means of the exclusive-OR gates $G_1$, $G_2$, the length in time of the output signals $B_{p1}$ or $B_{p2}$ of which corresponds to the phase difference $\alpha$ or $\beta$ between the input signals $U_D$, $U_S$ or $U_K$, $U_A$. In FIG. 3, a, b and c, the input, internal and output signals of the first phase comparator $Pk_1$ are shown in a typical mutual phase relationship, the signal $U_D$ leading the signal $U_S$ by 135°. Where the phase comparators $Pk_1$ or $Pk_2$ are designed in this way, the limit value monitoring function of the phase differences $\alpha$ or $\beta$ in the limit value detector GD preferably consists of the adjustable delay sections $V_1$ or $V_2$ which, after the delay times $t_{1\alpha}$ or $t_{1\beta}$, respectively, generate the output signals $B_F$ or BE, respectively, provided that the input signals $B_{p1}$ or $B_{p2}$ are still applied at this time. The signal $B_F$ is shown in FIG. 3d. However, if they are shorter than the time $t_{1\alpha}$ or $t_{1\beta}$, no signals will appear at the output of the delay sections $V_1$ or $V_2$ by which means the limit value monitoring function is implemented in a simple manner. For the adjustment of the limit value G for the phase angle $\alpha$ of the period $t_{1\alpha}$ and for the case, specially selected in this illustrative embodiment, of only two discrete values for the limit value G, the output signal BE of the second delay section $V_2$ is converted via the digital/analog converter DA into the voltage steps $Y_1$, $Y_2$ which directly correspond to the desired values of the delay time $t_{1\alpha}$ and hence to the limit value G. The delay times $t_{2\alpha}$ or $t_{2\beta}$ for setting back the output signals at the delay sections $V_1$ or $V_2$ are adjusted in such a manner that the fault signal $B_F$ is sufficiently long for the subsequent measuring systems of the distance relay and that the signal BE has a duration of at least half a period.

I claim:

1. A method for detecting faults on an electric line, using the principle of low impedance, comprising the steps of:
    deriving an image voltage signal and a line voltage signal which are respectively proportional to the current and the voltage in an electric line being tested for faults;
    generating a difference voltage signal based on the difference between said image voltage signal and said line voltage signal;
    generating a sum voltage signal from said image voltage signal and said line voltage signal;
    determining a first phase difference between said difference voltage signal and said sum voltage signal;
    determining a second phase difference between said image voltage signal and said line voltage signal;
    determining whether said second phase difference lies within a predetermined range of phase angle values;
    comparing said first phase difference to a first limit value when said second phase difference lies within said range and comparing said first phase difference to a second limit value when said second phase difference lies outside said range; and
    generating a fault signal if the first phase difference exceeds the limit value to which it is compared.

2. The method of claim 1 wherein said range is in the neighborhood of 0° and in the neighborhood of 180°.

3. The method of claim 2 wherein said range comprises 0°±30° and 180°±30°.

4. The method of claim 2 wherein said first limit value is 90° and said second limit value is 136°.

5. The method of claim 1 wherein said image voltage signal has a phase which leads the phase of the line current by 60°.

6. The method of claim 1 wherein said sum voltage signal is generated from an amplitude modulated version of said image voltage signal.

7. A device for detecting faults on electric lines, comprising:

a current/voltage transformer and a voltage transformer that are respectively responsive to the current and voltage in a line being tested for faults;

a resistor connected in parallel with the secondary windings of said current/voltage transformer;

a differencing circuit and a summing circuit each connected to the secondary windings of each of said transformers;

a first phase comparator connected to said differencing and summing circuits;

a second phase comparator connected to the secondary windings of said transformers; and a limit value detector, said detector including means for comparing an output signal of said first phase comparator with a limit value and means for adjusting said limit value in response to the output of said second phase comparator.

8. The device of claim 7 further including an amplifier connected between the secondary winding of said current/voltage transformer and said summing circuit.

9. The device of claim 7 wherein said comparing means of said limit value detector includes a first delay circuit having an adjustable time delay, and wherein said adjusting means includes a second delay circuit and a digital-to-analog convertor which is connected between said delay circuits for adjusting the time delay of said first delay circuit in accordance with the output of said second delay circuit.

* * * * *